United States Patent
Tressler et al.

(10) Patent No.: US 9,471,451 B2
(45) Date of Patent: *Oct. 18, 2016

(54) IMPLEMENTING ENHANCED WEAR LEVELING IN 3D FLASH MEMORIES

(71) Applicant: International Business Machines Corporation, Armonk, NY (US)

(72) Inventors: Gary A. Tressler, Sandy Hook, CT (US); Diyanesh Babu C. Vidyapoornachary, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 205 days.

This patent is subject to a terminal disclaimer.

(21) Appl. No.: 14/308,096

(22) Filed: Jun. 18, 2014

(65) Prior Publication Data

US 2015/0370635 A1    Dec. 24, 2015

(51) Int. Cl.
| G06F 11/00 | (2006.01) |
| G06F 11/20 | (2006.01) |
| G11C 16/34 | (2006.01) |
| G06F 12/02 | (2006.01) |
| G11C 29/00 | (2006.01) |

(52) U.S. Cl.
CPC ....... *G06F 11/2094* (2013.01); *G06F 12/0246* (2013.01); *G11C 16/3495* (2013.01); *G11C 29/70* (2013.01); *G06F 2212/1036* (2013.01); *G06F 2212/7211* (2013.01)

(58) Field of Classification Search
CPC ............ G06F 11/165; G06F 11/2094; G06F 2212/1036; G06F 2212/7211; G11C 16/3495; G11C 29/70
See application file for complete search history.

(56) References Cited

U.S. PATENT DOCUMENTS

| 7,120,729 B2 | 10/2006 | Gonzalez et al. |
| 7,409,492 B2 | 8/2008 | Tanaka et al. |
| 7,530,000 B2 * | 5/2009 | Fairhurst .............. G06F 11/004 714/41 |
| 8,214,580 B2 | 7/2012 | Lucas et al. |
| 8,261,013 B2 | 9/2012 | Schmidberger |
| 8,275,928 B2 | 9/2012 | Lin |
| 8,412,909 B2 * | 4/2013 | Cheon .................. G06F 3/0613 711/103 |
| 8,516,213 B2 | 8/2013 | He et al. |
| 8,516,343 B2 | 8/2013 | Flynn et al. |
| 8,612,804 B1 * | 12/2013 | Kang ................... G11C 16/349 714/42 |
| 9,158,672 B1 * | 10/2015 | Zheng ................. G06F 12/0246 |
| 2005/0055495 A1 * | 3/2005 | Vihmalo ............. G06F 12/0246 711/103 |
| 2010/0017650 A1 | 1/2010 | Chin et al. |
| 2010/0241793 A1 | 9/2010 | Sugimoto et al. |
| 2011/0099419 A1 | 4/2011 | Lucas et al. |
| 2011/0185113 A1 | 7/2011 | Goss et al. |
| 2011/0213908 A1 | 9/2011 | Bennett |

* cited by examiner

*Primary Examiner* — Joseph Kudirka
(74) *Attorney, Agent, or Firm* — Joan Pennington

(57) ABSTRACT

A method, system and computer program product are provided for implementing enhanced wear leveling in a stack of flash memory chips. A flash memory includes plurality of flash memory chips including a number N data chips and one or more spare chips. To even wear among the plurality of flash memory chips, a memory controller for the flash memory periodically transfers data from a data chip to a current spare chip, the current spare chip becomes a data chip and the selected data chip becomes the current spare chip. Over time, each chip in the stack becomes the spare chip. If a chip becomes nonfunctional, whatever chip is currently the spare chip becomes a permanent data chip and no more rotating is done.

11 Claims, 6 Drawing Sheets

IMPLEMENTING ENHANCED WEAR LEVELING IN 3D FLASH MEMORIES

FIELD OF THE INVENTION

The present invention relates generally to the data processing field, and more particularly, relates to a method, system and computer program product for implementing enhanced wear leveling in a stack of flash memory chips or 3D flash memories.

DESCRIPTION OF THE RELATED ART

Use of flash memories, for example, with the proliferation of solid state drive (SSD) technology into enterprise market segment, presents numerous challenges. For example, SSD controllers frequently do not provide the capability to correct for a full flash die failure.

In stacked flash memory devices, a separate chip can be provided to mitigate failure of any one of the operational flash chip. Often the spare chip is unused and kept reserved for future use, until failure occurs in any of the operation flash chips. Once failure occurs in any of the operational chips, then the spare chip will be facilitated for usage.

This approach fails to utilize the memory blocks uniformly across all chips in the stack, leading to non-uniform wear leveling and therefore reducing overall lifetime.

A need exists for an effective mechanism to enable enhanced wear leveling in 3D flash memories. It is desirable to provide such mechanism that enables needed robustness without compromising Reliability, Availability, and Serviceability (RAS) features.

SUMMARY OF THE INVENTION

Principal aspects of the present invention are to provide a method, system and computer program product for implementing enhanced wear leveling in a stack of flash memory chips. Other important aspects of the present invention are to provide such method, system and computer program product substantially without negative effects and that overcome many of the disadvantages of prior art arrangements.

In brief, a method, system and computer program product are provided for implementing enhanced wear leveling in a stack of flash memory chips. A flash memory includes plurality of flash memory chips including a number N data chips and one or more spare chips. To even wear among the plurality of flash memory chips, a memory controller for the flash memory periodically transfers data from a data chip to a current spare chip, the current spare chip becomes a data chip and the selected data chip becomes the current spare chip. Over time, each chip in the stack becomes the spare chip. If a chip becomes nonfunctional, whatever chip is currently the spare chip becomes a permanent data chip and no more rotating is done.

In accordance with features of the invention, the memory controller monitors the plurality of flash memory chips for a predetermined wear leveling (WL) threshold. The WL threshold is a user selected programmable value.

In accordance with features of the invention, when a particular active data chip adjacent to the current spare chip reaches the wear leveling (WL) threshold, then the data is migrated from the active data chip to the current spare chip and marked as a spare chip.

In accordance with features of the invention, the spare chip location moves through all positions in the chip stack, ensuring uniform wear leveling.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and memory controller are provided for implementing enhanced wear leveling in three dimensional (3D) flash memories.

Figure 1:
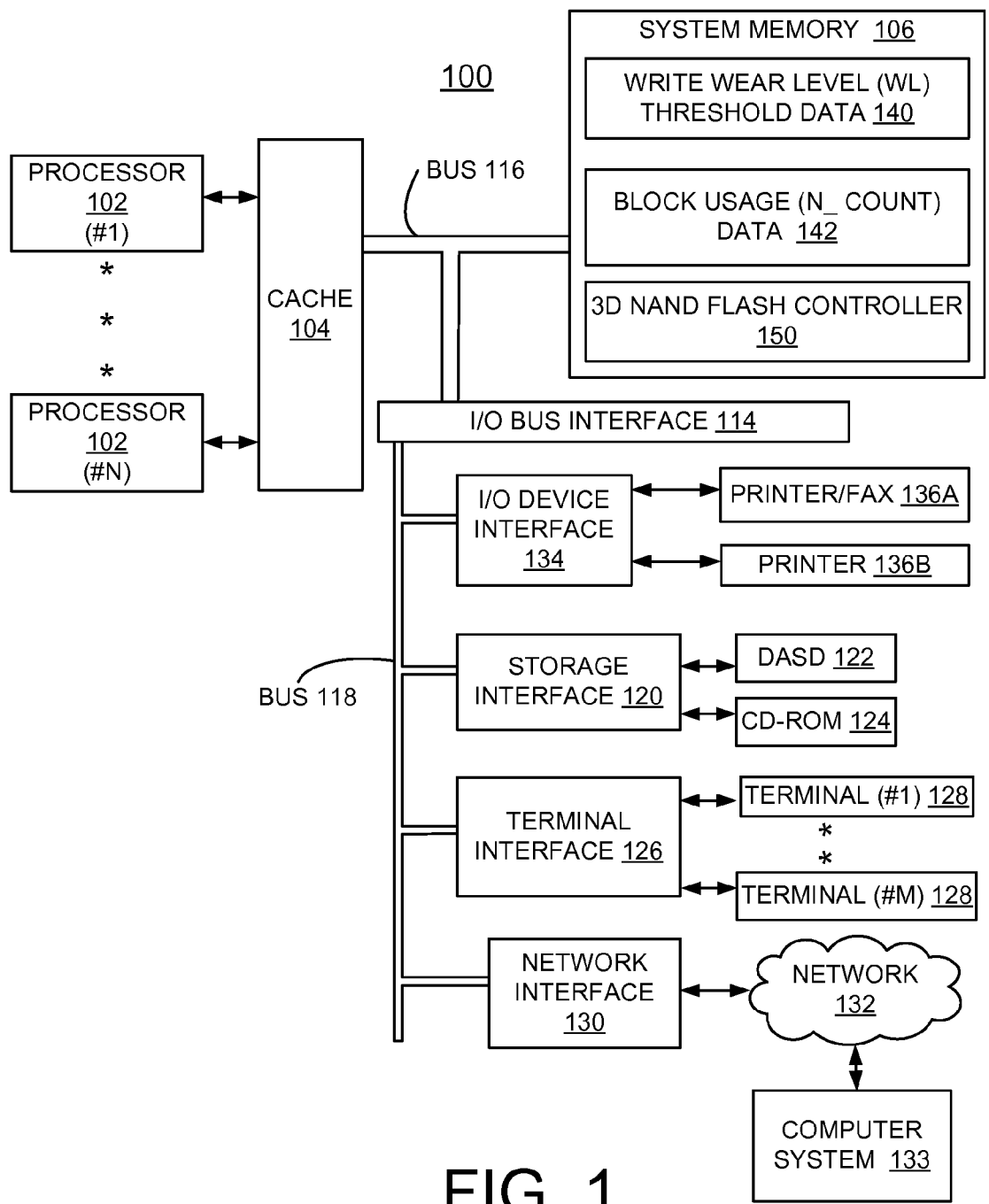
FIG. 1 is a block diagram of an example computer system for implementing enhanced wear leveling in a stack of flash memory chips in accordance with preferred embodiments.

Having reference now to the drawings, in FIG. 1, there is shown an example computer system generally designated by the reference character 100 for implementing enhanced wear leveling in flash memories in accordance with the preferred embodiment. Computer system 100 includes one or more processors 102 or general-purpose programmable central processing units (CPUs) 102, #1-N. As shown, computer system 100 includes multiple processors 102 typical of a relatively large system; however, system 100 can include a single CPU 102. Computer system 100 includes a cache memory 104 connected to each processor 102.

Computer system 100 includes a system memory 106. System memory 106 is a random-access semiconductor memory for storing data, including programs. System memory 106 is comprised of, for example, a dynamic random access memory (DRAM), a synchronous direct random access memory (SDRAM), a current double data rate (DDRx) SDRAM, non-volatile memory, optical storage, and other storage devices.

I/O bus interface 114, and buses 116, 118 provide communication paths among the various system components.

Bus 116 is a processor/memory bus, often referred to as front-side bus, providing a data communication path for transferring data among CPUs 102 and caches 104, system memory 106 and I/O bus interface unit 114. I/O bus interface 114 is further coupled to system I/O bus 118 for transferring data to and from various I/O units.

As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1-M, a network interface 130 coupled to a network 132, such as the Internet, local area or other networks, shown connected to another separate computer system 133, and a I/O device interface 134 coupled to I/O devices, such as a first printer/fax 136A, and a second printer 136B.

System memory 106 stores write wear level (WL) threshold data 140, block usage (N_count) data 142, and a controller, such as a 3D Nand flash controller 150 for implementing enhanced wear leveling in three dimensional (3D) flash memories in a computer system in accordance with the preferred embodiments.

Computer system 100 is shown in simplified form sufficient for understanding the present invention. The illustrated computer system 100 is not intended to imply architectural or functional limitations. The present invention can be used with various hardware implementations and systems and various other internal hardware devices.

In accordance with features of the invention, enhanced wear leveling is provided in a stack of flash memory chips having a given number N of data chips and one or more spare chips. To even wear among the N+1 (or N+2, and the like) chips, periodically data from a data chip is transferred to the spare chip and the spare chip becomes a data chip. Over time, each chip in the stack becomes the spare chip. If a chip in the stack becomes nonfunctional, whatever chip is currently the spare becomes a permanent data chip and no more rotating is done.

Figure 2:
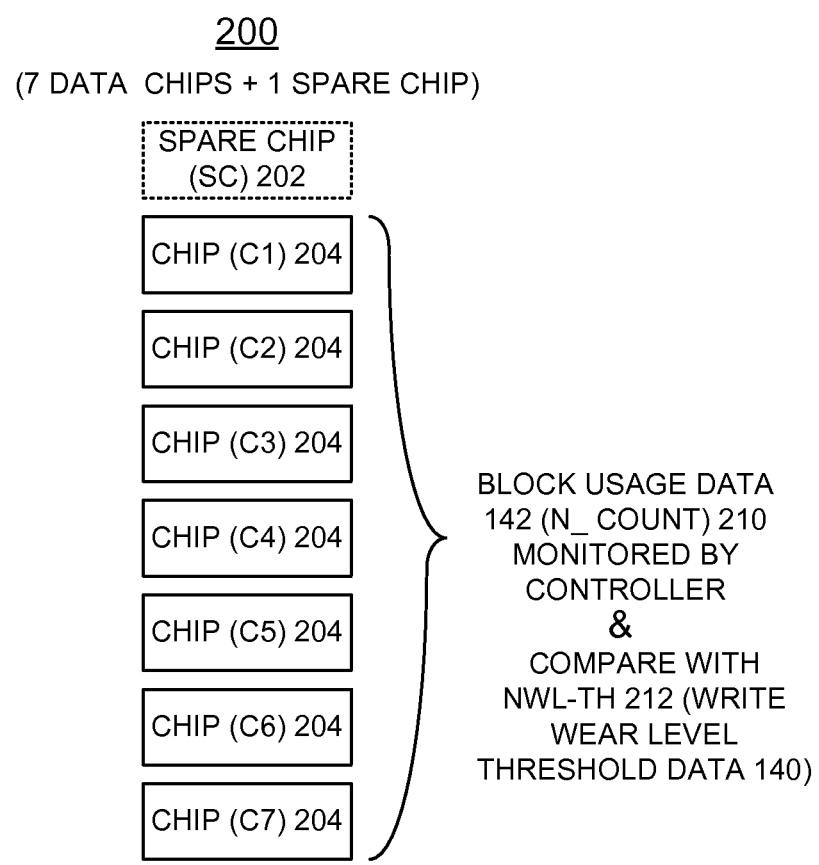
FIG. 2 is a block diagram illustrating a flash memory including a stack of flash memory chips in accordance with preferred embodiments.

Referring to FIG. 2, there is shown a diagram illustrating an example flash memory chip stack of flash memory chips generally designated by the reference character 200 in the computer system 100 in accordance with the preferred embodiments. As shown, flash memory chip stack 200 includes one spare chip (SC), 202 and a plurality of seven data chips C1-C7, 204. For example as shown in FIG. 2, block usage data 210 (N_count) data 142 of the data chips C1-C7, 204 of the flash memory chip stack 200 is monitored by the controller 150, and compared with NWL-TH 212 (write wear level (WL) threshold data 140).

Figure 3A:
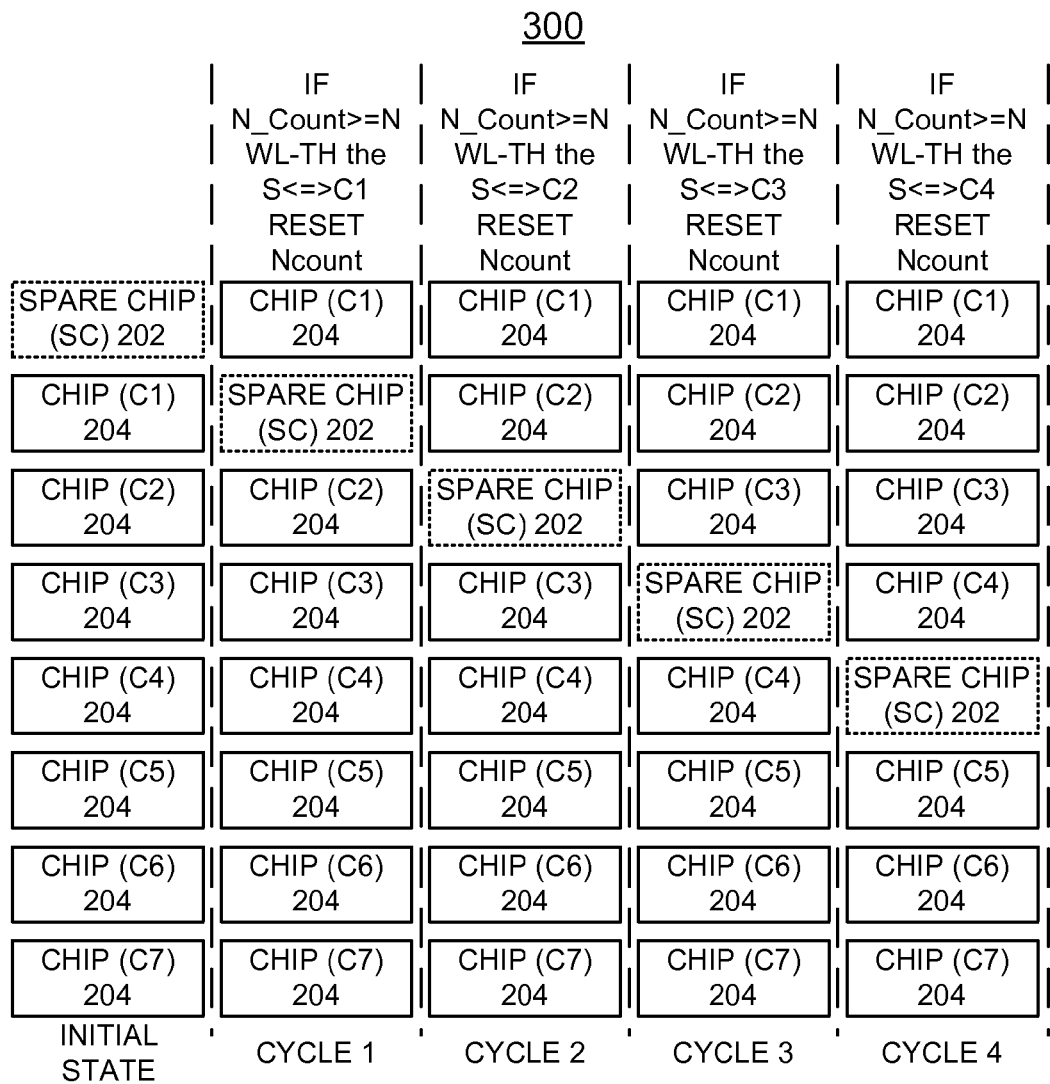
FIGS. 3A and 3B are diagrams illustrating respective example operations in the flash memory of FIG. 2 in accordance with the preferred embodiment.
Figure 3B:
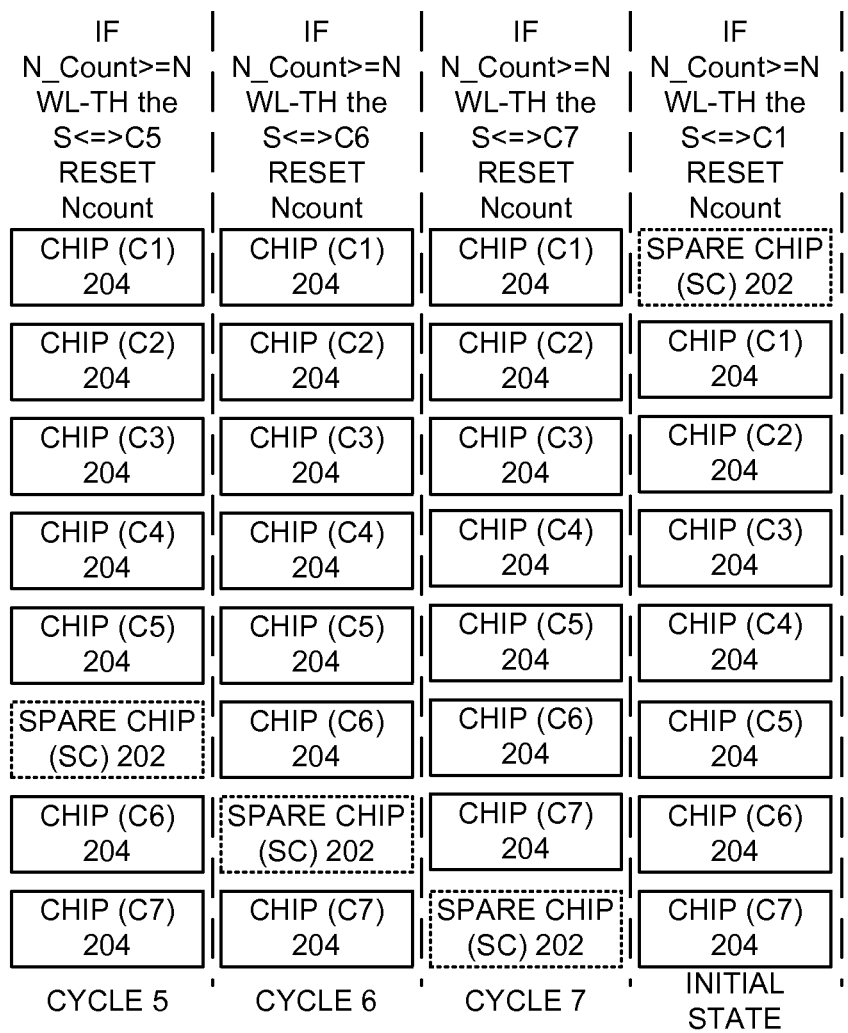

Referring to FIGS. 3A and 3B, there are shown diagrams illustrating respective example wear leveling operations respectively generally designated by the reference character 300, and 310 in the flash memory stack 200 in accordance with a preferred embodiment. In FIG. 3A, the example wear leveling operations 300 start in an initial state of the spare chip (SC), 202 and a plurality of seven data chips C1-C7, 204, as also shown in FIG. 2.

In accordance with features of the invention, enhanced wear leveling is provided in the flash memory chip stack 200, with a comparison of the block usage N_Count of an adjacent data chip to the spare chip in the chip stack with the write wear level (WL) threshold NWL-TH. If the usage reaches threshold in the adjacent data chip, then the spare and that chip are swapped by migrating the data content from the adjacent data chip to the spare chip and the adjacent data chip is marked as the spare chip.

As shown in FIG. 3A, in a first cycle (CYCLE 1) if N_Count is greater than or equal to NWL-TH, then the spare chip SC, 202 becomes data chip C1, 204, and the data chip C1, 204 becomes the spare chip SC, 202. In a second cycle (CYCLE 2) if N_Count is greater than or equal to NWL-TH, then the spare chip SC, 202 becomes data chip C2, 204, and the data chip C2, 204 becomes the spare chip SC, 202. In a third cycle (CYCLE 3) if N_Count is greater than or equal to NWL-TH, then the spare chip SC, 202 becomes data chip C3, 204, and the data chip C3, 204 becomes the spare chip SC, 202. In a fourth cycle (CYCLE 4) if N_Count is greater than or equal to NWL-TH, then the spare chip SC, 202 becomes data chip C4, 204, and the data chip C4, 204 becomes the spare chip SC, 202.

As shown in FIG. 3B, in a fifth cycle (CYCLE 5) if N_Count is greater than or equal to NWL-TH, then the spare chip SC, 202 becomes data chip C5, 204, and the data chip C5, 204 becomes the spare chip SC, 202. In a sixth cycle (CYCLE 6) if N_Count is greater than or equal to NWL-TH, then the spare chip SC, 202 becomes data chip C6, 204, and the data chip C6, 204 becomes the spare chip SC, 202. In a seventh cycle (CYCLE 7) if N_Count is greater than or equal to NWL-TH, then the spare chip SC, 202 becomes data chip C7, 204, and the data chip C7, 204 becomes the spare chip SC, 202. In a eighth cycle (CYCLE 8 or Initial State) if N_Count is greater than or equal to NWL-TH, then the spare chip SC, 202 becomes data chip C1, 204, and the data chip C1, 204 becomes the spare chip SC, 202.

Figure 4:
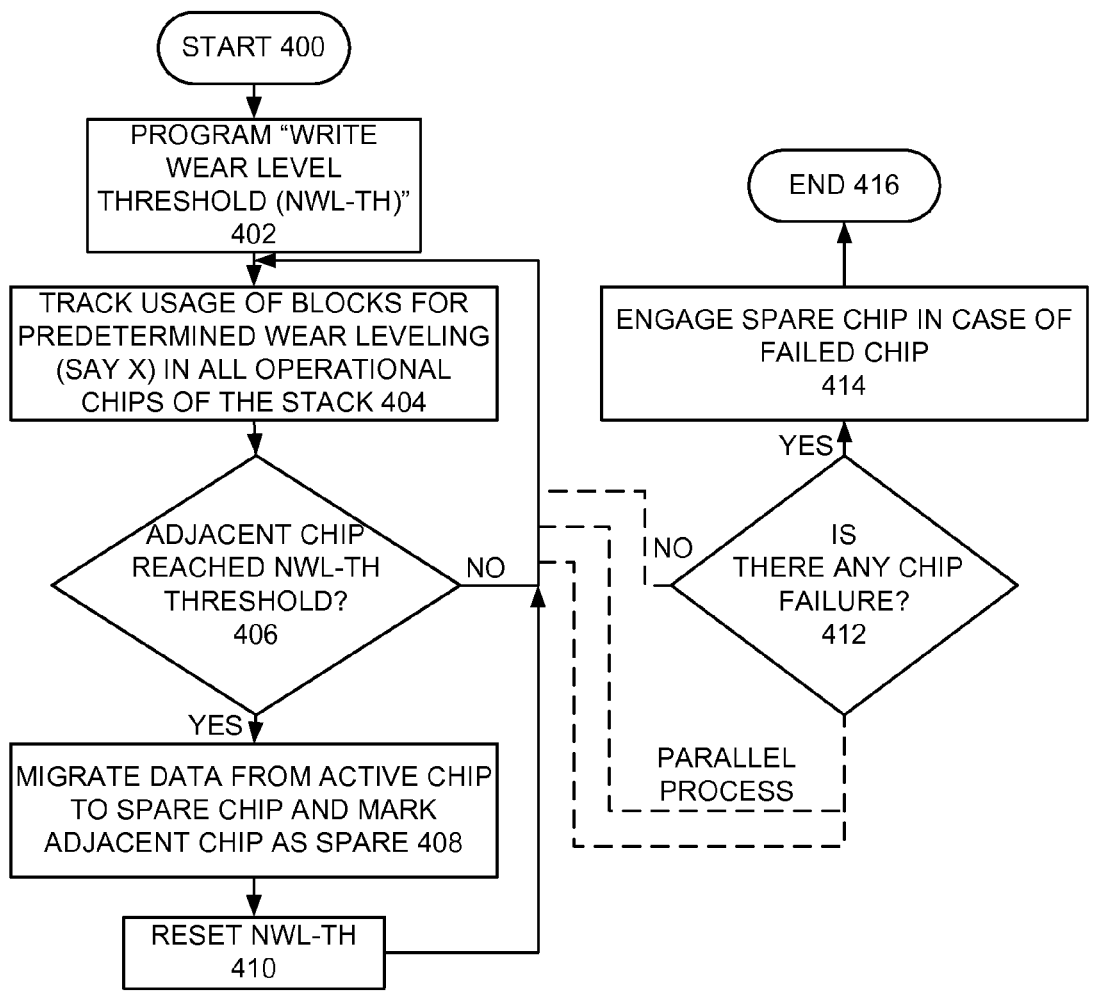
FIG. 4 is a flow chart illustrating example operations for implementing enhanced wear leveling in the system of FIG. 1 and the flash memory of FIG. 2 in accordance with preferred embodiments.

Referring to FIG. 4, there are shown example operations for implementing enhanced wear leveling in the system of FIG. 1 and the flash memory of FIG. 2 in accordance with preferred embodiments starting at a block 400. For example, an initial state of 8 memory chip stack such as chip stack 200, one chip is set as the spare chip (SC), 202 and seven data chips C1-C7, 204 are set as normal data chips.

As indicated in a block 402, the flash controller programs write wear level threshold (NWL-TH), which optionally is user selected for blocks of active chips and the spare chip is turned off.

The flash controller tracks usage of blocks for predetermined wear leveling (say X) in all operational or active data chips in flash memory chip stack as indicated in a block 404. Checking if an adjacent chip has reached the write wear level threshold (NWL-TH) is performed as indicated in a decision block 406.

If one or more blocks in an adjacent chip, such as a first chip of the memory chip stack, for example data chip C1, 204 as shown in FIGS. 2, 3A, 3B, reaches the write wear level threshold (NWL-TH), then the flash controller migrates the usage to spare C0, 202 and updates the logical to physical address mapping detail and marks the adjacent chip as the spare chip as indicated in a block 408. Then the write wear level threshold (NWL-TH) is reset as indicated in a block 410. The operations return to block 406 to track usage of blocks for predetermined wear leveling in all operational or active data chips in flash memory chip stack, repeating the sequential steps across all other functional chips sequentially to ensure uniform wear leveling.

A parallel process also is performed as indicated in a decision block 412, the flash controller monitors to identify any chip failure. When a chip failure is identified, then the spare chip is engaged in place of the failed chip, providing RAS mitigation as indicated in a block 414. When a chip in the stack becomes nonfunctional or fails, whatever chip is currently the spare becomes a permanent data chip at block 414 and no more rotating is done as indicated in a block 416.

Figure 5:
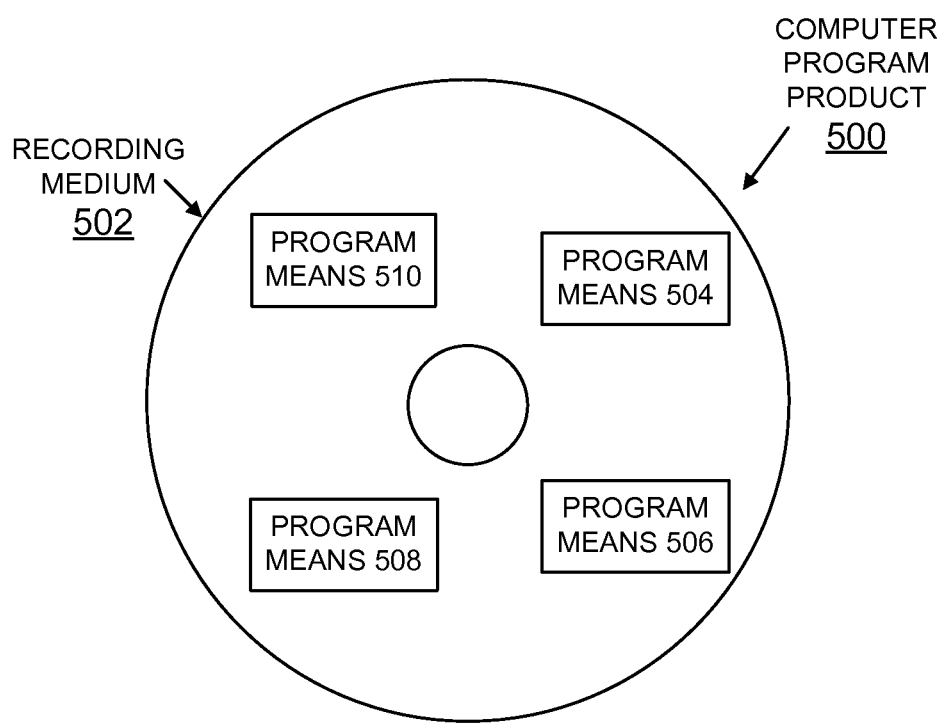
FIG. 5 is a block diagram illustrating a computer program product in accordance with the preferred embodiment.

Referring now to FIG. 5, an article of manufacture or a computer program product 500 of the invention is illustrated. The computer program product 500 is tangibly embodied on a non-transitory computer readable storage medium that includes a recording medium 502, such as, a floppy disk, a high capacity read only memory in the form of an optically read compact disk or CD-ROM, a tape, or another similar computer program product. Recording medium 502 stores program means 504, 506, 508, and 510 on the medium 502 for carrying out the methods for implementing enhanced wear leveling control of the preferred embodiment in the computer system 100 of FIG. 1.

A sequence of program instructions or a logical assembly of one or more interrelated modules defined by the recorded program means 504, 506, 508, and 510, direct the memory system 100 for implementing enhanced wear leveling of the preferred embodiments.

While the present invention has been described with reference to the details of the embodiments of the invention shown in the drawing, these details are not intended to limit the scope of the invention as claimed in the appended claims.

What is claimed is:

1. A system for implementing enhanced wear leveling in a stack of flash memory chips comprising:
    a flash memory chip stack including a number N of active data chips and one or more spare chips;
    a memory controller, said memory controller periodically transferring data from an active data chip to a current spare chip, the current spare chip becoming a data chip and the active data chip becoming the current spare chip;
    said memory controller continuing the periodic data transfer from an active data chip to a current spare chip with each of the flash memory chips becoming the spare chip over a time interval to even wear among all the flash memory chips; and
    said memory controller responsive to a chip failure, causing the current spare chip to become a permanent data chip ending the periodic data transfer.

2. The system as recited in claim 1 including control code stored on a computer readable medium, and wherein said memory controller uses said control code to implement enhanced wear leveling control.

3. The system as recited in claim 1 including said memory controller storing a predetermined wear leveling (WL) threshold value.

4. The system as recited in claim 3 wherein the predetermined wear leveling (WL) threshold value is a user selected programmable value.

5. The system as recited in claim 1 including said memory controller moving a spare chip location through all positions in the flash memory chip stack, ensuring uniform wear leveling.

6. The system as recited in claim 1 including said memory controller monitoring the flash memory chip stack to identify a chip failure.

7. The system as recited in claim 6 including said memory controller using the current spare chip in place of an identified failed data chip.

8. The system as recited in claim 7 including said memory controller ending the periodic data transfer.

9. A system for implementing enhanced wear leveling in a stack of flash memory chips comprising:
    a flash memory chip stack including a number N of active data chips and one or more spare chips;
    a memory controller, said memory controller periodically transferring data from an active data chip to a current spare chip, the current spare chip becoming a data chip and the active data chip becoming the current spare chip;
    said memory controller continuing the periodic data transfer from an active data chip to a current spare chip with each of the flash memory chips becoming the spare chip over a time interval to even wear among all the flash memory chips; and
    said memory controller responsive to a chip failure, causing the current spare chip to become a permanent data chip ending the periodic data transfer; and
    said memory controller monitoring the flash memory chip stack to identify block usage of a predetermined wear leveling (WL) threshold.

10. A system for implementing enhanced wear leveling in a stack of flash memory chips comprising:
    a flash memory chip stack including a number N of active data chips and one or more spare chips;
    a memory controller, said memory controller periodically transferring data from an active data chip to a current spare chip, the current spare chip becoming a data chip and the active data chip becoming the current spare chip;
    said memory controller continuing the periodic data transfer from an active data chip to a current spare chip with each of the flash memory chips becoming the spare chip over a time interval to even wear among all the flash memory chips;
    said memory controller responsive to a chip failure, causing the current spare chip to become a permanent data chip ending the periodic data transfer; and
    said memory controller identifying a wear leveling (WL) threshold value for a particular active data chip adjacent to the current spare chip, and migrating data from the particular active data chip to the current spare chip.

11. The system as recited in claim 10 including said memory controller marking the particular active data chip as the current spare chip.

* * * * *